United States Patent
Enami

(10) Patent No.: US 9,951,186 B2
(45) Date of Patent: Apr. 24, 2018

(54) SILICONE GEL COMPOSITION AND USE THEREOF

(71) Applicant: DOW CORNING TORAY CO., LTD., Tokyo (JP)

(72) Inventor: Hiroji Enami, Chiba (JP)

(73) Assignee: DOW CORNING TORAY CO., LTD, Tokyo (JP)

( * ) Notice: Subject to any disclaimer, the term of this patent is extended or adjusted under 35 U.S.C. 154(b) by 0 days.

(21) Appl. No.: 14/916,241

(22) PCT Filed: Aug. 29, 2014

(86) PCT No.: PCT/JP2014/073424
§ 371 (c)(1),
(2) Date: Mar. 3, 2016

(87) PCT Pub. No.: WO2015/034029
PCT Pub. Date: Mar. 12, 2015

(65) Prior Publication Data
US 2016/0215099 A1    Jul. 28, 2016

(30) Foreign Application Priority Data

Sep. 3, 2013   (JP) ................... 2013-182085

(51) Int. Cl.
| | | |
|---|---|---|
| *H01L 23/29* | (2006.01) | |
| *C08L 83/04* | (2006.01) | |
| *C08G 77/44* | (2006.01) | |
| *C08K 3/24* | (2006.01) | |
| *C08K 3/16* | (2006.01) | |
| *C08L 83/14* | (2006.01) | |
| *H01L 33/56* | (2010.01) | |
| *C08G 77/58* | (2006.01) | |
| *C08G 77/12* | (2006.01) | |
| *C08G 77/20* | (2006.01) | |
| *C08G 77/398* | (2006.01) | |

(52) U.S. Cl.
CPC ............... *C08G 77/44* (2013.01); *C08K 3/16* (2013.01); *C08K 3/24* (2013.01); *C08L 83/04* (2013.01); *C08L 83/14* (2013.01); *H01L 23/296* (2013.01); *H01L 33/56* (2013.01); *C08G 77/12* (2013.01); *C08G 77/20* (2013.01); *C08G 77/398* (2013.01); *C08G 77/58* (2013.01)

(58) Field of Classification Search
CPC ............................. H01L 23/296; H01L 33/56
USPC .................. 524/588; 257/791, 795
See application file for complete search history.

(56) References Cited

U.S. PATENT DOCUMENTS

| | | | | |
|---|---|---|---|---|
| 5,708,067 | A * | 1/1998 | Akamatsu | ............... C08L 83/14 |
| | | | | 252/78.3 |
| 2010/0280163 | A1 | 11/2010 | Hasegawa et al. | |
| 2011/0245426 | A1* | 10/2011 | Nabeta | .................... C08L 83/04 |
| | | | | 525/209 |

FOREIGN PATENT DOCUMENTS

| | | | |
|---|---|---|---|
| EP | 0440168 | A2 | 8/1991 |
| EP | 0781812 | A2 | 7/1997 |
| JP | S48-17847 | A | 3/1973 |
| JP | S56-143241 | A | 11/1981 |
| JP | H01-272682 | A | 10/1989 |
| JP | H03-250051 | A | 7/1990 |
| JP | H02-269771 | A | 11/1990 |
| JP | 2008291148 | A | 12/2008 |
| WO | WO2008082001 | A1 | 7/2008 |
| WO | WO 2009/154261 | A1 * | 12/2009 |

OTHER PUBLICATIONS

PCT/JP2014/073424 International Search Report dated Dec. 4, 2014, 3 pages.
English language abstract and machine translation for JPH01-272682 (A) extracted from http://worldwide.espacenet.com database dated Feb. 22, 2016, 11 pages.
English language abstract and machine translation for JPH02-269771 (A) extracted from http://worldwide.espacenet.com database dated Feb. 22, 2016, 10 pages.
English language abstract and machine translation for JP2008291148(A) extracted from http://worldwide.espacenet.com database dated Feb. 22, 2016, 21 pages.
Machine translation for JPS48-017847(A) extracted from https://4.j-platpat.inpit.go.jp database dated Mar. 3, 2016, 6 pages.
English language abstract and machine translation for JPS56-143241(A) extracted from https://4.j-platpat.inpit.go.jp database dated Mar. 3, 2016, 8 pages.

* cited by examiner

*Primary Examiner* — Marc S Zimmer
(74) *Attorney, Agent, or Firm* — Warner Norcross & Judd LLP

(57) ABSTRACT

A silicone gel composition comprising: (A) branched organopolysiloxane having, on average, at least two alkenyl groups bonded to silicon atoms in a molecule, and a viscosity ranging from 10 to 10,000 mPa·s at 25° C.; (B) organohydrogenpolysiloxane; (C) platinum-based addition reaction catalyst; and (D) a reaction product of (d1) alkali metal silanolate with (d2) at least one ceric salt selected from cerium chloride and a carboxylic acid salt of cerium.

19 Claims, No Drawings

SILICONE GEL COMPOSITION AND USE THEREOF

CROSS-REFERENCE TO RELATED APPLICATIONS

This application is the National Stage of International Application No. PCT/JP2014/073424 filed on 29 Aug. 2014, which claims priority to and all advantages of Japanese Patent Application No. 2013-182085 filed on 3 Sep. 2013, the content of which is hereby incorporated by reference.

TECHNICAL FIELD

The present invention relates to a silicone gel composition that provides a silicone gel-cured material having excellent transparency, heat resistance, and cold resistance when the composition is cured. The present invention also relates to a sealant for an electronic component containing the silicone gel composition and an electronic component comprising the silicone gel-cured material. Priority is claimed on Japanese Patent Application No. 2013-182085 filed on Sep. 3, 2013, the content of which is incorporated herein by reference.

BACKGROUND ART

Silicone gel compositions are addition reaction curable organopolysiloxane compositions comprising: organohydrogenpolysiloxane having a silicon-bonded hydrogen atom (i.e. an SiH group); organopolysiloxane having an alkenyl group such as a silicon-bonded vinyl group; and a platinum-based catalyst; and the addition reaction curable organopolysiloxane compositions provide cured materials that are gel-like and have low crosslinking density via an addition reaction of silicon-bonded hydrogen atom to the alkenyl group (e.g. Patent Documents 1 to 3). Silicone gel-cured materials cured by heating the silicone gel compositions are used for protecting electronic components, such as electronic components for vehicles and for consumer use, due to their excellent heat resistance, weather resistance, oil resistance, cold resistance, electrical insulating properties, and the like, as well as having low elastic modulus and low stress. Other elastomer products do not exhibit low elastic modulus and low stress at the same time, which is a characteristic of the silicone gel-cured materials. In recent years, heat resistance is also increasingly required in silicone gel materials formed from a silicone gel-cured material that is used for sealing due to requirements for enhancing reliability for electronic components for vehicles and for consumer use, and the like.

In a typical silicone rubber, a method in which a filler such as carbon or iron oxide is filled has been used as a method for increasing heat resistance. However, this method is not easily applicable to silicone gel materials that are required to have transparency and low viscosity since the method involving filling filler causes negative effects such as decrease in transparency, precipitation of the filler, and decrease in workability due to increased viscosity.

On the other hand, use of cerium compounds has been known for imparting heat resistance (e.g. Patent Documents 4 to 7). In particular, Patent Document 4 proposes that, by using a cerium-containing reaction product, obtained by heat-treating a siloxane composition that contains cerium compound and the like at a temperature of 150° C. or higher, in an addition reaction curable organopolysiloxane composition that provides a gel-like cured material, a silicone gel-cured material having a superior heat resistance at high temperatures compared to conventional silicone gel-cured materials can be obtained.

However, in recent years, operating temperatures of these electronic components, particularly silicone chips, have been increased to approximately 175° C., from the conventional operating temperature of approximately 150° C., along with the application in an electronic component called "power device" being more popular. In addition, operating temperature of 200° C. or greater has been increasingly demanded due to SiC semiconductors being more popular. Furthermore, compared to conventional electronic components, these electronic components have been increasingly used under severe conditions involving high temperatures as well as significant temperature differences and/or rapid changes in the temperatures. Silicone gel-cured materials obtained by these publicly known silicone gel compositions need further improvement in heat resistance when used under higher temperatures and more severe conditions than conventionally used conditions. In addition, when the conventional silicone gel-cured materials are used in, for example, power units or electronic components for vehicles used in space or a location at a high latitude where the temperature difference is significant and when the power units or electronic components are exposed to low temperatures below −40° C., there has been a problem that deterioration occurs.

BACKGROUND DOCUMENTS

Patent Documents

Patent Document 1: Japanese Unexamined Patent Application Publication No. S48-017847A
Patent Document 2: Japanese Unexamined Patent Application Publication No. S56-143241A
Patent Document 3: Japanese Unexamined Patent Application Publication No. H02-269771A
Patent Document 4: Japanese Unexamined Patent Application Publication No. H01-272682A
Patent Document 5: Japanese Unexamined Patent Application Publication No. H03-250051A
Patent Document 6: WO/2008/082001
Patent Document 7: Japanese Unexamined Patent Application Publication No. 2008-291148A

SUMMARY OF INVENTION

The present invention has been completed in light of the foregoing. An object of the present invention is to provide a silicone gel composition that has excellent storage stability and that provides a silicone gel-cured material having excellent heat resistance and transparency at high temperatures, being capable of maintaining low elastic modulus, low stress, and high transparency even when the cured material is used at a high temperature for a long period of time, having excellent cold resistance at low temperatures lower than −40° C., and hardly causing deterioration of the gel. Furthermore, another object of the present invention is to provide a sealant for an electronic component containing the silicone gel composition and an electronic component comprising the silicone gel-cured material obtained by curing the silicone gel composition.

Solution to Problem

As a result of conducting diligent research to solve the above problems, the present inventor has discovered that the above problems can be solved by using a silicone gel composition comprising: (A) branched organopolysiloxane having a branched structure and, on average, at least two alkenyl groups in a molecule, and a viscosity ranging from 10 to 10,000 mPa·s at 25° C.; (B) organohydrogenpolysiloxane; (C) a platinum-based addition reaction catalyst; and (D) a reaction product of particular amounts of alkali metal silanolate and a ceric salt, and thus completed the present invention. Furthermore, the present inventor has discovered that the above problems can be more efficiently solved by further comprising (A2) linear organopolysiloxane, in a particular proportion relative to the amount of the component (A), having at least two alkenyl groups in a molecule, and thus completed the present invention. In addition, the present inventor has discovered that the above problems can be solved by a sealant for an electronic component containing the silicone gel composition and an electronic component comprising the silicone gel-cured material obtained by curing the silicone gel composition, and thus completed the present invention.

In particular, the silicone gel composition of the present invention is a silicone gel composition comprising:

(A) branched organopolysiloxane in an amount of 100 parts by mass, having, on average, at least two alkenyl group bonded to silicon atoms in a molecule, and a viscosity ranging from 10 to 10,000 mPa·s at 25° C.;

(B) organohydrogenpolysiloxane in an amount so that an amount of hydrogen atoms bonded to silicon atoms is 0.7 to 1.2 per one alkenyl group bonded to silicon atom in a total amount of the composition, having at least two hydrogen atoms bonded to silicon atoms (hereinafter, also simply called "silicon-bonded hydrogen atom") in a molecule, and a viscosity ranging from 2 to 1,000 mPa·s at 25° C.;

(C) a platinum-based addition reaction catalyst in an amount so that an amount of platinum-based metal is from 0.01 to 1,000 ppm in the total amount of the composition; and, (D) a reaction product, in an amount of 0.2 to 10.0 parts by mass, of (d1) alkali metal silanolate with (d2) at least one ceric salt selected from cerium chloride and a carboxylic acid salt of cerium.

The silicone gel composition of the present invention, more preferably, further comprises (A2) linear organopolysiloxane, in an amount of 2 to 150 parts by mass per 100 parts by mass of the component (A), having at least two alkenyl group bonded to silicon atoms in a molecule, and a viscosity ranging from 1.0 to 10,000 mPa·s at 25° C.

Among total siloxane units constituting the branched organopolysiloxane molecule of the component (A), preferably from 80.0 to 99.8 mol % of the units are $R_2SiO_{2/2}$ units, from 0.1 to 10.0 mol % of the units are $RSiO_{3/2}$ units, and from 0.1 to 10.0 mol % of the units are $R_3SiO_{1/2}$ units (all the R groups represent monovalent hydrocarbon groups bonded to a silicon atom); and of these R groups, from 0.25 to 4.00 mol % are preferably the alkenyl group bonded to silicon atoms.

In the silicone gel composition of the present invention, the reaction product of the component (D) preferably comprises from 0.5 to 5.0 mass % of cerium metal. In particular, the component (d1) of the component (D) is preferably an alkali metal silanolate compound obtained by subjecting (d1-1) at least one cyclic organopolysiloxane to a ring opening reaction using (d1-2) an alkali metal hydroxide, and then subjecting the resulting product to a further reaction with (d1-3) organopolysiloxane having a viscosity ranging from 10 to 10,000 mPa·s at 25° C. Furthermore, the compounded amount of the component (D) is preferably such that a content of cerium metals in the component (D) is from 0.005 to 0.15 mass % based on the total amount of the composition.

The silicone gel composition of the present invention is suitably used as a sealant for an electronic component, particularly a transparent sealant for a power device.

The silicone gel-cured material of the present invention is substantially transparent and has 10 to 150 of direct reading value of ¼ consistency defined by JIS K 2220.

According to the present invention, an electronic component comprising the silicone gel-cured material of the present invention, in particular a power device comprising the silicone gel-cured material, can be provided. Similarly, a general lighting device, optical substrate, or photoelectric substrate having the silicone gel-cured material can be also provided.

By using the silicone gel composition and a cured material thereof of the present invention, a method for protecting semiconductor chips that are required to have, in particular, heat resistance and cold resistance and used under severe conditions can be provided. Note that the semiconductor chips include light-emitting semiconductor elements such as LEDs.

Advantageous Effects of Invention

The silicone gel composition of the present invention has excellent storage stability and, when cured, the composition can provide a silicone gel-cured material having excellent heat resistance and transparency at high temperatures exceeding 200° C., being capable of maintaining low elastic modulus, low stress, and high transparency even when the cured material is used at a high temperature for a long period of time, having excellent cold resistance at low temperatures lower than −40° C., and hardly causing deterioration of the gel. Furthermore, according to the present invention, a sealant for an electronic component containing the silicone gel composition and an electronic component comprising the silicone gel-cured material can be provided. When the silicone gel-cured material formed by curing the silicone gel composition of the present invention is used for the purpose of protecting an electronic component such as an IC and hybrid IC, since the silicone gel-cured material can maintain transparency even at high temperatures exceeding 200° C., which is the temperature required for SiC semiconductors, and is hardly deteriorated at low temperatures in addition to enhancing long term durability due to its excellent heat resistance, an electronic component having high reliability and high durability, even when used under severe conditions with significant temperature differences, can be provided.

By using the silicone gel composition and a cured material thereof of the present invention, a method for protecting semiconductor chips that are required to have, in particular, heat resistance and cold resistance and used under severe conditions can be provided. The semiconductor chip obtained by the protection method described above functions as an electronic component having high reliability and high durability even when used in space, a location at high latitude, under extreme environment, and the like compared to protection methods using conventional silicone gels.

DESCRIPTION OF EMBODIMENTS

Each of the components will be described below in detail. Note that, in the present specification, viscosity is a value measured at 25° C. using a B type viscometer in accordance with JIS K 7117-1.

[Silicone Gel Composition]

(A) Branched Organopolysiloxane

The branched organopolysiloxane of the component (A) is one of base compounds (base polymer) of the silicone gel composition. The branched organopolysiloxane has a branched structure due to a certain amount of $RSiO_{3/2}$ units, has, on average, at least two alkenyl groups bonded to silicon atoms in a molecule, and has a viscosity ranging from 10 to 10,000 mPa·s.

By using this component, the silicone gel composition of the present invention can provide a silicone gel-cured material, in particular, having excellent cold resistance even at low temperatures below −40° C. Furthermore, when used in combination with the component (D), this component can provide a silicone gel-cured material having excellent transparency and heat resistance even at high temperatures exceeding 200° C., and being capable of maintaining low elastic modulus, low stress, and high transparency even when the cured material is used at a high temperature for a long period of time.

The branched organopolysiloxane (A) can be represented by average structural formula 1 below:

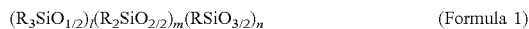

$(R_3SiO_{1/2})_l(R_2SiO_{2/2})_m(RSiO_{3/2})_n$  (Formula 1)

In formula 1, R represents a monovalent hydrocarbon group, and
l, m, and n are each independently integers greater than or equal to 1, and preferably l+m+n is less than or equal to 200.

The branched organopolysiloxane (A) preferably has a certain amount of branched structure in order to impart suitable cold resistance to the silicone-cured material of the present invention. Specifically, among total siloxane units constituting the branched organopolysiloxane (A) molecule, preferably from 80.0 to 99.8 mol % of the units are $R_2SiO_{2/2}$ units, from 0.1 to 10.0 mol % of the units are $RSiO_{3/2}$ units, and from 0.1 to 10.0 mol % of the units are $R_3SiO_{1/2}$ units. That is, the ratio m:n:l in formula 1 is preferably 80.0 to 99.8:0.1 to 10.0:0.1 to 10.0. m:n:l is more preferably 80.0 to 98.9:1.0 to 10.0:0.1 to 10.0, and further preferably 80.0 to 96.9:3.0 to 10.0:0.1 to 10.0. As a result of the branched organopolysiloxane (A) having such a branched structure, a silicone gel-cured material having excellent cold resistance, particularly, at low temperatures can be obtained. Note that the mole ratio of $R_2SiO_{2/2}$ units to $RSiO_{3/2}$ units to $R_3SiO_{1/2}$ units in the total siloxane units of the branched organopolysiloxane (A) is a value determined by a measurement using Nuclear Magnetic Resonance (NMR).

Examples of the monovalent hydrocarbon group (i.e. R described above) bonded to a silicon atom in polysiloxane structural units, that is the group in a main chain, in a side chain of a branched chain, or at a terminal, in the branched organopolysiloxane (A) include a substituted or unsubstituted monovalent hydrocarbon group containing no unsaturated aliphatic bonds or monovalent alkenyl group. When this monovalent hydrocarbon group R bonded to a silicon atom is a substituted or unsubstituted monovalent hydrocarbon group containing no unsaturated aliphatic bonds, the monovalent hydrocarbon group R has typically from 1 to 10 carbons, and preferably from 1 to 6 carbons. Specific examples include alkyl groups such as a methyl group, ethyl group, propyl group, isopropyl group, butyl group, isobutyl group, tert-butyl group, pentyl group, hexyl group, cyclohexyl group, octyl group, and decyl group; aryl groups such as a phenyl group, tolyl group, and naphthyl group; aralkyl groups such as a benzyl group and phenyl ethyl group; and groups obtained by substituting some or all of the hydrogen atoms in these groups with halogen atoms such as chlorine atoms, bromine atoms, and fluorine atoms, such as a chloromethyl group and 3,3,3-trifluoropropyl group. Of these, from the perspective of ease of synthesis, a methyl group, phenyl group, or 3,3,3-trifluoropropyl group are preferable.

The branched organopolysiloxane (A) has, on average, at least two alkenyl groups bonded to silicon atoms in a molecule (hereinafter, also called "silicon-bonded alkenyl group"). These alkenyl groups are alkenyl groups typically having from 2 to 6 carbons, preferably from 2 to 4 carbons, and more preferably from 2 to 3 carbons. Specific examples of the alkenyl groups include vinyl groups, allyl groups, propenyl groups, isopropenyl groups, butenyl groups, and isobutenyl groups. The alkenyl groups are preferably vinyl groups.

In all of the monovalent hydrocarbon groups R bonded to silicon atoms in the average structural units of the branched organopolysiloxane (A), preferably from 0.10 to 4.00 mol % of the units, more preferably from 0.25 to 3.00 mol % of the units, and further preferably from 0.50 to 2.00 mol % of the units, are silicon-bonded alkenyl groups. As a result of containing such an amount of silicon-bonded alkenyl groups in the branched organopolysiloxane (A), a silicone gel-cured material having a flexibility that is in a range of 10 to 150 of direct reading value of ¼ consistency defined by JIS K 2220. Note that the amount of alkenyl groups in the branched organopolysiloxane (A) is a value quantitatively determined using a Fourier transform infrared spectrometer.

The branched organopolysiloxane (A) has a viscosity ranging from 10 to 10,000 mPa·s at 25° C. The viscosity at 25° C. of the branched organopolysiloxane (A) is preferably in a range of 10 to 5,000 mPa·s, and more preferably in a range of 10 to 1,000 mPa·s. The branched organopolysiloxane (A) having such a viscosity imparts the composition suitable handling/workability and fluidity, and imparts the resulting cured material suitable strength.

The branched organopolysiloxane (A) can be synthesized to have a desired viscosity and structural design using a publicly known method. For example, the branched organopolysiloxane (A) can be prepared, for example, via equilibrium polymerization performed by heating a hydrolysate containing each of the siloxane units represented by $RSiO_{3/2}$, $R_2SiO_{2/2}$, and $R_3SiO_{1/2}$, $ViR_2SiOSiR_2Vi$, and cyclic polysiloxane $(R_2SiO)_n$ (in each of the formulas, R represents a monovalent hydrocarbon group such as an alkyl group, and Vi represents an alkenyl group such as a vinyl group) in the presence of potassium silanolate, in accordance with the description in Examples of Japanese Unexamined Patent Application Publication No. S61-016295A.

(A2) Linear Organopolysiloxane

The linear organopolysiloxane of the component (A2) is an optional component and used in combination with the component (A) described above to enhance heat resistance and physical properties of the resulting silicone gel-cured material. Specifically, linear organopolysiloxane (A2) has at least two alkenyl groups bonded to silicon atoms in a molecule, and a viscosity ranging from 1.0 to 10,000 mPa·s.

The linear organopolysiloxane (A2) can be represented by average structural formula 2 below:

$(R_3SiO_{1/2})_p(R_2SiO_{2/2})_q$  (Formula 2)

In formula 2, R represents the same group as the monovalent hydrocarbon groups in general formula (1) of the component (A) described above.

p and q are each independently integers greater than or equal to 1, and preferably p+q is less than or equal to 500.

Among total siloxane units constituting the linear organopolysiloxane (A2), from 90.0 to 99.9 mol % of the units are $R_2SiO_{2/2}$ units, and from 0.1 to 10.0 mol % of the units are $R_3SiO_{1/2}$ units. That is, the ratio q:p is preferably 90.0 to 99.9:0.1 to 10.0. The ratio q:p is more preferably 95.0 to 99.5:0.5 to 5.0, and further preferably 97.0 to 99.0:1.0 to 3.0. Due to the linear organopolysiloxane (A2) having such a structure, a silicone gel-cured material having a flexibility that is in a range of 10 to 150 of direct reading value of ¼ consistency defined by JIS K 2220 can be obtained. Note that the mole ratio of $R_2SiO_{2/2}$ units to $R_3SiO_{1/2}$ units in the total siloxane units of the linear organopolysiloxane (A2) is a value determined by a measurement using Nuclear Magnetic Resonance (NMR).

Examples of the organopolysiloxane represented by general formula (2) above include dimethylpolysiloxane capped at both molecular terminals with dimethylvinylsiloxy groups, copolymers of dimethylsiloxane and methylvinylsiloxane capped at both molecular terminals with dimethylvinylsiloxy groups, copolymers of dimethylsiloxane and diphenylsiloxane capped at both molecular terminals with dimethylvinylsiloxy groups, copolymers of dimethylsiloxane, methylvinylsiloxane, and diphenylsiloxane capped at both molecular terminals with dimethylvinylsiloxy groups, methyltrifluoropropylpolysiloxane capped at both molecular terminals with dimethylvinylsiloxy groups, copolymers of dimethylsiloxane and methyltrifluoropropylsiloxane capped at both molecular terminals with dimethylvinylsiloxy groups, copolymers of dimethylsiloxane, methyltrifluoropropylsiloxane, and methylvinylsiloxane capped at both molecular terminals with dimethylvinylsiloxy groups, copolymers of dimethylsiloxane and vinylmethylsiloxane capped at both molecular terminals with trimethylsiloxy groups, copolymers of dimethylsiloxane, vinylmethylsiloxane, and diphenylsiloxane capped at both molecular terminals with trimethylsiloxy groups, copolymers of vinylmethylsiloxane and methyltrifluoropropylsiloxane capped at both molecular terminals with trimethylsiloxy groups, dimethylpolysiloxane capped at molecular terminals with a trimethylsiloxy group and dimethylvinylsiloxy group, copolymers of dimethylsiloxane and methylvinylsiloxane capped at molecular terminals with a trimethylsiloxy group and dimethylvinylsiloxy group, copolymers of dimethylsiloxane and diphenylsiloxane capped at molecular terminals with a trimethylsiloxy group and dimethylvinylsiloxy group, copolymers of dimethylsiloxane, diphenylsiloxane, and methylvinylsiloxane capped at molecular terminals with a trimethylsiloxy group and dimethylvinylsiloxy group, methyltrifluoropropylpolysiloxane capped at molecular terminals with a trimethylsiloxy group and dimethylvinylsiloxy group, copolymers of dimethylsiloxane and methyltrifluoropropylsiloxane capped at molecular terminals with a trimethylsiloxy group and dimethylvinylsiloxy group, copolymers of dimethylsiloxane, methyltrifluoropropylsiloxane, and methylvinylsiloxane capped at molecular terminals with a trimethylsiloxy group and dimethylvinylsiloxy group, dimethylpolysiloxane capped at both molecular terminals with methyldivinylsiloxy groups, copolymers of dimethylsiloxane and methylvinylsiloxane capped at both molecular terminals with methyldivinylsiloxy groups, copolymers of dimethylsiloxane and diphenylsiloxane capped at both molecular terminals with methyldivinylsiloxy groups, copolymers of dimethylsiloxane, methylvinylsiloxane, and diphenylsiloxane capped at both molecular terminals with methyldivinylsiloxy groups, methyltrifluoropropylpolysiloxane capped at both molecular terminals with methyldivinylsiloxy groups, copolymers of dimethylsiloxane and methyltrifluoropropylsiloxane capped at both molecular terminals with methyldivinylsiloxy groups, copolymers of dimethylsiloxane, methyltrifluoropropylsiloxane, and methylvinylsiloxane capped at both molecular terminals with methyldivinylsiloxy groups, dimethylpolysiloxane capped at both molecular terminals with trivinylsiloxy groups, copolymers of dimethylsiloxane and methylvinylsiloxane capped at both molecular terminals with trivinylsiloxy groups, copolymers of dimethylsiloxane and diphenylsiloxane capped at both molecular terminals with trivinylsiloxy groups, copolymers of dimethylsiloxane, methylvinylsiloxane, and diphenylsiloxane capped at both molecular terminals with trivinylsiloxy groups, methyltrifluoropropylpolysiloxane capped at both molecular terminals with trivinylsiloxy groups, copolymers of dimethylsiloxane and methyltrifluoropropylsiloxane capped at both molecular terminals with trivinylsiloxy groups, copolymers of dimethylsiloxane, methyltrifluoropropylsiloxane, and methylvinylsiloxane capped at both molecular terminals with trivinylsiloxy groups, and the like.

In all of the monovalent hydrocarbon groups R bonded to silicon atoms in the structural units of the linear organopolysiloxane (A2), preferably from 0.25 to 4.00 mol % of the units, more preferably from 0.50 to 3.00 mol % of the units, and further preferably from 1.00 to 2.00 mol % of the units, are silicon-bonded alkenyl groups. As a result of containing such an amount of silicon-bonded alkenyl groups in the linear organopolysiloxane (A2), a silicone gel-cured material having a flexibility that is in a range of 10 to 150 of direct reading value of ¼ consistency defined by JIS K 2220. Note that the amount of alkenyl groups in the linear organopolysiloxane (A2) is a value quantitatively determined using a Fourier transform infrared spectrometer.

The viscosity at 25° C. of the linear organopolysiloxane (A2) is in a range of 1.0 to 10,000 mPa·s, preferably in a range of 1.0 to 1,000 mPa·s, and more preferably in a range of 5.0 to 500 mPa·s. The linear organopolysiloxane (A2) having such a viscosity can impart the composition suitable handling/workability and fluidity, and impart the resulting cured material suitable strength.

The content of the linear organopolysiloxane (A2) in the silicone gel composition is from 2 to 150 parts by mass, and preferably from 2 to 100 parts by mass, per 100 parts by mass of the component (A). By using the linear organopolysiloxane (A2) in this range in combination with the branched organopolysiloxane (A), physical properties of the resulting silicone gel-cured material can be enhanced while cold resistance is also enhanced, and stability and handleability of the composition can be further enhanced. Furthermore, this is also cost effective. On the other hand, if the used amount of the component (A2) exceeds the upper limit of the range described above, cold resistance of the resulting silicone gel-cured material can be insufficient.

(B) Organohydrogenpolysiloxane

The organohydrogenpolysiloxane of the component (B) is a component that reacts with the component (A) and the component (A2) described above and acts as a crosslinking agent of the present composition. The organohydrogenpolysiloxane (B) has at least two hydrogen atoms bonded to silicon atoms in a molecule, and a viscosity ranging from 2 to 1,000 mPa·s.

The organohydrogenpolysiloxane (B) has at least two, and preferably at least three, hydrogen atoms bonded to silicon atoms (SiH group) in a molecule. The number of hydrogen atoms bonded to silicon atoms (SiH group) in a molecule of the organohydrogenpolysiloxane (B) is preferably from 3 to 500 atoms, more preferably from 4 to 200 atoms, further preferably from 5 to 100 atoms, and particularly preferably from 10 to 80 atoms. Furthermore, the amount of the hydrogen atoms bonded to silicon atoms in the organohydrogenpolysiloxane (B) can be measured by infrared spectrophotometer.

An organohydrogenpolysiloxane represented by, for example, average composition formula represented by $R^1_e H_f SiO_{[(4-e-f)/2]}$ can be suitably used as the organohydrogenpolysiloxane (B). In this average composition formula, $R^1$ is a substituted or unsubstituted monovalent hydrocarbon group with the exception of aliphatic unsaturated hydrocarbon groups. Examples of the $R^1$ group include alkyl groups such as a methyl group, ethyl group, propyl group, isopropyl group, butyl group, isobutyl group, tert-butyl group, pentyl group, neopentyl group, hexyl group, cyclohexyl group, octyl group, nonyl group, and decyl group; aryl groups such as a phenyl group, tolyl group, xylyl group, and naphthyl group; aralkyl groups such as a benzyl group, phenylethyl group, and phenylpropyl group; and halogen-substituted alkyl groups such as a 3-chloropropyl group, 2-bromoethyl group, and 3,3,3-trifluoropropyl group. In the formula, a and f preferably satisfy $1.0 < a \leq 2.0$, $0.1 < f < 1.0$, and $1.5 \leq a+f < 2.7$.

No particular limitation is placed on the molecular structure of the organohydrogenpolysiloxane (B), and this structure may be linear, partially branched linear, branched, cyclic, or three-dimensional mesh-like. The molecular structure of the component (B) is preferably partially branched linear, branched, or three-dimensional mesh-like.

The viscosity at 25° C. of the organohydrogenpolysiloxane (B) is in a range of 1.0 to 1,000 mPa·s, preferably in a range of 1.0 to 500 mPa·s, and more preferably in a range of 2.0 to 150 mPa·s. The organohydrogenpolysiloxane (B) having such a viscosity imparts the composition suitable handling/workability and fluidity, and imparts the resulting cured material suitable strength.

Examples of such an organohydrogenpolysiloxane (B) include 1,1,3,3-tetramethyldisiloxane, 1,3,5,7-tetramethylcyclotetrasiloxane, methylhydrogencyclopolysiloxane, tris(dimethylhydrogensiloxy)methylsilane, tris(dimethylhydrogensiloxy)phenylsilane, cyclic copolymers of methylhydrogensiloxane and dimethylsiloxane, methylhydrogenpolysiloxane capped at both molecular terminals with dimethylhydrogensiloxy groups, copolymers of methylhydrogensiloxane and dimethylsiloxane capped at both molecular terminals with dimethylhydrogensiloxy groups, copolymers of methylhydrogensiloxane and diphenylsiloxane capped at both molecular terminals with dimethylhydrogensiloxy groups, copolymers of methylhydrogensiloxane, dimethylsiloxane, and diphenylsiloxane capped at both molecular terminals with dimethylhydrogensiloxy groups, methylhydrogenpolysiloxane capped at both molecular terminals with trimethylsiloxy groups, copolymers of dimethylsiloxane and methylhydrogensiloxane capped at both molecular terminals with trimethylsiloxy groups, copolymers of methylhydrogensiloxane and diphenylsiloxane capped at both molecular terminals with trimethylsiloxy groups, copolymers of methylhydrogensiloxane, diphenylsiloxane, and dimethylsiloxane capped at both molecular terminals with trimethylsiloxy groups, copolymers comprising $H(CH_3)_2SiO_{1/2}$ unit and $SiO_{4/2}$ unit, copolymers comprising $(CH_3)_3SiO_{1/2}$ unit and $H(CH_3)_2SiO_{1/2}$ unit and $SiO_{4/2}$ unit, and groups obtained by substituting some or all of the methyl groups in these exemplified compounds with another alkyl group, such as an ethyl group or propyl group, or aryl group, such as a phenyl group, and the like. The organohydrogenpolysiloxane (B) may also be a mixture of two or more types.

The content of the organohydrogenpolysiloxane (B) in the silicone gel composition is in an amount so that an amount of hydrogen atoms bonded to silicon atoms is preferably 0.7 to 1.2, and more preferably 0.8 to 1.0 per one alkenyl group in the component (A). By adjusting the content of the organohydrogenpolysiloxane (B) in the silicone gel composition to this range, a silicone gel-cured material having excellent heat resistance and physical properties can be obtained. If the amount of hydrogen atoms bonded to silicon atoms of the component (B) per one alkenyl group in the component (A) is less than the lower limit, it will be hard to obtain a cured material. Furthermore, if the amount of hydrogen atoms bonded to silicon atoms of the component (B) per one alkenyl group in the component (A) is greater than the upper limit, heat resistance of the cured material will be decreased. In addition, if the amount of hydrogen atoms bonded to silicon atoms of the component (B) per one alkenyl group in the component (A) is outside the range between the upper limit and the lower limit, physical properties of the resulting silicone gel-cured material may be significantly deteriorated. Furthermore, when the silicone gel composition contains the component (A2), the content of the organohydrogenpolysiloxane (B) in the silicone gel composition may be in an amount so that an amount of hydrogen atoms bonded to silicon atoms is from 0.7 to 1.2, and preferably from 0.8 to 1.0 per one alkenyl group in the total alkenyl groups contained in the component (A) and alkenyl groups contained in the component (A2).

(C) Platinum-Based Addition Reaction Catalyst

The composition (C) of the present invention is used as a catalyst for accelerating addition reaction (i.e. hydrosilylation reaction) between the silicon-bonded alkenyl groups in the component (A) and the component (A2) and the silicon-bonded hydrogen atoms in the component (B). Any publicly known platinum-based compound (platinum or a platinum-containing compound) can be used as the component (C). Examples of the component (C) include platinum fine powders, platinum black, chloroplatinic acid, alcohol-modified products of chloroplatinic acid, complexes of chloroplatinic acid and diolefin, platinum-olefin complexes, platinum-carbonyl complexes such as platinum bis-(acetoacetate) and platinum bis-(acetylacetonate), chloroplatinic acid-alkenylsiloxane complexes such as chloroplatinic acid-divinyltetramethyldisiloxane complexes and chloroplatinic acid-tetravinyltetramethylcyclotetrasiloxane complexes, platinum-alkenylsiloxane complexes such as platinum-divinyltetramethyldisiloxane complexes and platinum-tetravinyltetramethylcyclotetrasiloxane complexes, and complexes of chloroplatinic acid and acetylene alcohols. Platinum-alkenylsiloxane complexes are particularly preferable due to their excellent effect of accelerating hydrosilylation reactions. One type of these hydrosilylation reaction catalysts may be used alone, or two or more types may be used in combination.

The alkenylsiloxane used in the platinum-alkenylsiloxane complex is not particularly limited, and examples include 1,3-divinyl-1,1,3,3-tetramethyldisiloxane, 1,3,5,7-tetramethyl-1,3,5,7-tetravinylcyclotetrasiloxane, alkenylsiloxane oligomers in which some of the methyl groups of these alkenylsiloxanes are substituted with ethyl groups, phenyl groups, or the like, and alkenylsiloxane oligomers in which the vinyl groups of these alkenylsiloxanes are substituted with allyl groups, hexenyl groups, or the like. In particular, 1,3-divinyl-1,1,3,3-tetramethyldisiloxane is preferable due to the favorable stability of the platinum-alkenylsiloxane complex that is produced.

In order to improve the stability of the platinum-alkenylsiloxane complexes, it is preferable to dissolve these platinum-alkenylsiloxane complexes in an alkenylsiloxane oligomer such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, or 1,3,5,7-tetramethyl-1,3,5,7-tetravinylcyclotetrasiloxane or an organosiloxane oligomer such as a dimethylsiloxane oligomer, and it is particularly preferable to dissolve the complexes in an alkenylsiloxane oligomer.

The compounded amount of the component (C) may be an effective amount, and can be appropriately adjusted depending on the desired curing rate; however, the compounded amount of the component (C) is typically in an amount so that an amount of platinum-based metal is from 0.1 to 1,000 ppm, and preferably from 1 to 300 ppm, in the total mass of the composition. If the compounded amount exceeds the upper limit of the range, there are no advantage in terms of the curing rate, and this is economically unfavorable due to the price (cost) of the platinum.

(D) Reaction Product of (d1) Alkali Metal Silanolate with (d2) at Least One Ceric Salt Selected from Cerium Chloride and a Carboxylic Acid Salt of Cerium The component (D) is used for enhancing heat resistance of the present composition. The reaction product of the component (D) particularly preferably contains from 0.5 to 5.0 mass % of cerium (metal). The alkali metal silanolate (d1) is preferably an alkali metal silanolate compound obtained by subjecting (d1-1) at least one cyclic organopolysiloxane to a ring opening reaction using (d1-2) an alkali metal hydroxide, and then subjecting the resulting product to a further reaction with (d1-3) organopolysiloxane having a viscosity ranging from 10 to 10,000 mPa·s at 25° C.

The cyclic organopolysiloxane of the component (d1-1) is not particularly limited, and examples thereof include a cyclic organopolysiloxane represented by general formula 3 below:

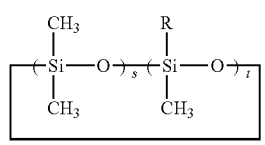
(Formula 3)

In formula 3, R represents the same group as the monovalent hydrocarbon groups in general formula (1) of the component (A) described above.

s and t are each independently integers from 0 to 8, provided that 3≤m+n≤8.

Examples of the cyclic organopolysiloxane (d1-1) include hexamethyl cyclotrisiloxane (D3), octamethyl cyclotetrasiloxane (D4), decamethyl cyclopentasiloxane (D5), dodecamethyl-cyclohexasiloxane (D6), 1,1-diethylhexamethyl cyclotetrasiloxane, phenylheptamethyl cyclotetrasiloxane, 1,1-diphenylhexamethyl cyclotetrasiloxane, 1,3,5,7-tetravinyltetramethyl cyclotetrasiloxane, 1,3,5,7-tetramethyl cyclotetrasiloxane, 1,3,5,7-tetracyclohexyltetramethyl cyclotetrasiloxane, tris(3,3,3-trifluoropropyl) trimethylcyclotrisiloxane, 1,3,5,7-tetra(3-methacryloxypropyl) tetramethyl cyclotetrasiloxane, 1,3,5,7-tetra(3-acryloxypropyl) tetramethyl cyclotetrasiloxane, 1,3,5,7-tetra(3-carboxypropyl) tetramethyl cyclotetrasiloxane, 1,3,5,7-tetra(3-vinyloxypropyl) tetramethyl cyclotetrasiloxane, 1,3,5,7-tetra(p-vinylphenyl) tetramethyl cyclotetrasiloxane, 1,3,5,7-tetra[3-(p-vinylphenyl) propyl]tetramethyl cyclotetrasiloxane, 1,3,5,7-tetra(N-acryloyl-N-methyl-3-aminopropyl) tetramethyl cyclotetrasiloxane, 1,3,5,7-tetra(N,N-bis (lauroyl)-3-aminopropyl) tetramethyl cyclotetrasiloxane, and the like. Furthermore, the component (d1-1) may be a mixture of various organopolysiloxanes.

The alkali metal hydroxide of the component (d1-2) is not particularly limited, and examples thereof include a sodium hydroxide, potassium hydroxide, and the like. The amount of such a component (d1-2) is not particularly limited, but is typically from 0.1 to 10.0 parts by mass per 100 parts by mass of the component (d1-1).

Any conventionally known organopolysiloxanes having a viscosity at 25° C. in a range of 100 to 1,000,000 mPa·s can be used as the organopolysiloxane of the component (d1-3), and the organopolysiloxane is substantially a linear or branched organopolysiloxane that is liquid at room temperature and has repeating diorganopolysiloxane units (linear-chain structure) as a main constituent. The organic group bonded the silicon atom (i.e. substituted or unsubstituted monovalent hydrocarbon group) can be the same organic group exemplified as R in general formula (1) of the component (A). Specifically, the organic group is selected from alkyl groups such as a methyl group, ethyl group, propyl group, and butyl group; alkenyl groups such as a vinyl group and allyl group; aryl groups such as a phenyl group and tolyl group; cycloalkyl groups such as a cyclohexyl group; groups obtained by substituting some or all of these hydrogen atoms bonded to carbon atoms with halogen atoms, cyano groups, or the like, such as a chloromethyl group, fluoropropyl group, and cyanomethyl group, or the like. Examples of the organopolysiloxanes include organopolysiloxanes having molecular terminals capped with triorganosiloxy groups including trialkylsiloxy groups such as a trimethylsiloxy group, alkenyldialkylsiloxy groups such as a vinyldimethylsiloxy group, dialkenylalkylsiloxy groups such as a divinylmethylsiloxy group, trialkenylsiloxy groups such as a trivinylsiloxy group, and the like, or an organopolysiloxane having molecular terminals capped with a hydroxyl group, alkoxy group, or the like.

The viscosity of the organopolysiloxane of the component (d1-3) is in a range of 10 to 10,000 mPa·s, and preferably in a range of 50 to 1,000 mPa·s, at 25° C. In the case where the viscosity of the component (d1-3) is 10 mPa·s or less, there are problems that the amount of evaporated siloxane tends to be greater at high temperatures and the change in the mass will be greater. The amount of such a component (d1-3) is not particularly limited, but is typically from 0.1 to 10 parts by mass per 100 parts by mass of the component (d1-1).

The ceric salt of the component (d2) is cerium chloride or a carboxylic acid salt of cerium. The carboxylic acid salt of cerium is represented by general formula: $(R^4COO)_nM^1$. In the formula, $R^4$ represents the same type or different types of monovalent hydrocarbons. $M^1$ represents cerium or a mixture of rare earth elements containing cerium as a main component, and examples include ceric salts of 2-ethylhexanoic acid, naphthenic acid, oleic acid, lauric acid, stearic acid, and the like. Note that, from the perspective of ease of handling, the carboxylic acid salt of cerium is preferably used as an organic solvent solution. Examples of the organic solvent include petroleum based-solvent such as a standard solvent, mineral spirits, ligroin, and petroleum ether, and aromatic solvent such as toluene and xylene.

The amount of the ceric salt of the component (d2) is not particularly limited, but the amount of the ceric salt is preferably in an amount so that an amount of cerium is from 0.05 to 5 parts by mass, and more preferably in an amount so that an amount of cerium is from 0.1 to 3 parts by mass, per 100 parts total mass of the component (d1) described above.

The added amount of the component (D) is from 0.20 to 10.0 parts by mass, preferably from 0.2 to 5.0 parts by mass, and particularly preferably from 0.20 to 0.5 parts by mass, per 100 parts by mass of the component (A), and, more specifically, the added amount is a small quantity that is approximately 0.2 parts by mass, 0.3 parts by mass, or 0.4 parts by mass. Furthermore, the added amount of the component (D) is preferably in an amount so that an amount of cerium metal content in the component (D) is from 0.005 to 0.15 mass %, and more preferably in an amount so that an amount of cerium metal content in the component (D) is from 0.01 to 0.1 wt. %, in the total amount of the composition. By adjusting the amount of the component (D) to this range, heat resistance of the resulting silicone gel composition can be advantageously enhanced. In the case where the added amount of the component (D) is less than 0.20 parts by mass, effects of enhancing heat resistance at high temperatures cannot be achieved. On the other hand, in the case where the added amount of the component (D) exceeds 15 parts by mass, transparency of the silicone gel-cured material reduces as well as cost of producing the silicone gel composition increases, thereby making it economically disadvantageous.

The component (D) can be obtained by mixing the components (d1) and (d2) and then heat-treating the mixture at a temperature of 150° C. or higher. The heating temperature of the heat treatment is preferably from 150 to 310° C., more preferably from 200 to 305° C., and further preferably from 250 to 300° C. In the case where the heating temperature is less than 150° C., a uniform composition is hardly obtained. In the case where the heating temperature exceeds 310° C., for example, a problem of increase in the pyrolyzing rate of the component (d1-3) arises.

(Other Optional Component)

In addition to the components (A) to (D) described above, the composition of the present invention can contain another optional component at an amount that does not impair the object of the present invention. Examples of the optional component include reaction inhibitors, inorganic fillers, organopolysiloxanes that are free of silicon-bonded hydrogen atoms and silicon-bonded alkenyl groups, adhesion-imparting agents, heat resistance-imparting agents, flame retarders, thixotropy imparting agents, pigments, dye, and the like.

The adhesion-imparting agent is a component that enhances the adhesion of the silicone gel to a substrate and the like. Examples of the adhesion-imparting agent include silane coupling agents such as methyl trimethoxysilane, vinyl trimethoxysilane, allyl trimethoxysilane, 3-methacryloxypropyl trimethoxysilane, 3-glycidoxypropyl trimethoxysilane, 3-aminopropyl trimethoxysilane, N-(2-aminoethyl)-3-aminopropyl trimethoxysilane, bis(trimethoxysilyl) propane, and bis(trimethoxysilyl)hexane; titanium compounds such as tetraethyl titanate, tetrapropyl titanate, tetrabutyl titanate, tetra(2-ethylhexyl)titanate, titanium ethylacetonate, and titanium acetylacetonate; aluminum compounds such as aluminum ethylacetoacetate diisopropylate, aluminum tris(ethylacetoacetate), aluminum alkylacetoacetate diisopropylate, aluminum tris(acetylacetonate), and aluminum monoacetylacetonate bis(ethylacetoacetate); zirconium compounds such as zirconium acetylacetonate, zirconium butoxyacetylacetonate, zirconium bisacetylacetonate, and zirconium ethylacetoacetate; organosilicon compounds selected from silane represented by general formula $(R^2O)_n SiR^3_{4-n}$, disclosed in Japanese Unexamined Patent Application Publication No. 2002-322364, and partially hydrolyzed condensates thereof (in the formula, $R^1$ represents an alkyl or alkoxyalkyl group, $R^3$ represents a substituted or unsubstituted monovalent hydrocarbon group, and n is 3 or 4. An alkyl group represented by $R^2$ may be the same or different type, and is preferably an alkyl group having from 1 to 4 carbons, and further preferably a methyl group, ethyl group, or propyl group. Furthermore, an example of an alkoxyalkyl group represented by $R^2$ include methoxyethyl. Examples of the monovalent hydrocarbon group represented by $R^3$ include alkyl groups such as a methyl group, ethyl group, propyl group, butyl group, pentyl group, hexyl group, heptyl group, octyl group, nonyl group, decyl group, and octadecyl group; cycloalkyl groups such as a cyclopentyl group and cyclohexyl group; aryl groups such as a phenyl group, tolyl group, xylyl group, and naphthyl group; aralkyl groups such as a benzyl group, phenethyl group, and phenylpropyl group; halogenated alkyl groups such as a 3-chloropropyl group and 3,3,3-trifluoro propyl group. The monovalent hydrocarbon group represented by $R^3$ is preferably an alkyl group having from 1 to 4 carbons, a 3,3,3-trifluoropropyl group, or a phenyl group, and the most preferably a methyl group). These adhesion-imparting agents can be optionally used in a range that gives a silicone gel composition that is substantially transparent and has 200 or less of direct reading value of ¼ consistency defined by JIS K 2220 when silicone gel-cured material containing the adhesion-imparting agent of the present invention is evaluated by the method described in the Examples section of the present application. In particular, the type and the amount of the adhesion-imparting agent are preferably selected and used in a range such that the transparency of the silicone gel-cured material is not lowered or the curing is not inhibited. As the adhesion-imparting agent, a titanium compound described above, a silane represented by general formula $(R^2O)_n SiR^3_{4-n}$, a partially hydrolyzed condensate thereof, or a combination of these is most preferably used. Here, the content of the adhesion-imparting agent described above is not limited; however, the content of the adhesion-imparting agent is preferably from 0.001 to 5.0 mass % in the total amount of the composition.

The reaction inhibitor is a composition for inhibiting the hydrosilylation reaction of the silicone gel composition, and specific examples of the reaction inhibitor include an acetylene-based, such as ethynylcyclohexanol, an amine-based, a carboxylate-based, and a phosphite-based reaction inhibitor, and the like. The added amount of the reaction inhibitor is typically from 0.001 to 5 mass % in the total amount of the silicone gel composition. In particular, for the purpose of enhancing the handling/workability of the silicone gel composition, acetylene-based compounds such as 3-methyl-1-butyn-3-ol, 3,5-dimethyl-1-hexyn-3-ol, and 3-phenyl-1-butyn-3-ol; en-yne compounds such as 3-methyl-3-penten-1-yne and 3,5-dimethyl-3-hexen-1-yne; cycloalkenylsiloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; triazole compounds such as benzotriazole can be used without any particular limitations.

Examples of the inorganic filler include inorganic fillers such as fumed silica, crystalline silica, precipitated silica, hollow filler, silsesquioxane, fumed titanium dioxide, magnesium oxide, zinc oxide, iron oxide, aluminum hydroxide, magnesium carbonate, calcium carbonate, zinc carbonate, layered mica, carbon black, diatomaceous earth, and glass fibers; fillers in which the surface of these fillers are hydrophobization-treated by an organosilicon compound such as an organoalkoxysilane compound, an organochlorosilane compound, an organosilazane compound, or a low molecular weight siloxane compound; and the like. In addition, silicone rubber powder, silicone resin powder, or the like may also be compounded. However, in the case where the silicone gel composition is required to have transparency and low viscosity, the inorganic filler is preferably not compounded; however, in the case where the inorganic filler is compounded, the amount of the inorganic filler is preferably 20 mass % or less, and particularly preferably 10 mass % or less, in the total amount of the composition.

[Preparation of Silicone Gel Composition]

The silicone gel composition of the present invention can be prepared by mixing the components (A) to (D) (and an optional component, in the case where an optional component is compounded) described above by a conventional method. At this time, the components to be mixed can be, as necessary, divided into two or more portions and then mixed. For example, the components to be mixed can be divided into a portion containing a part of the component (A) and the components (C) and (D) and a portion containing the remaining part of the component (A) and the component (B), separately mix each of the portions, and then mix the two portions to prepare the mixed component. In particular, the reaction inhibitor described above as an optional component is preferably contained in any one of the portions.

The method of mixing each component of the silicone composition can be a conventionally known method and is not particularly limited. Typically, a uniform mixture can be produced by simple stirring. Furthermore, in the case where a solid component such as an inorganic filler is contained as an optional component, more preferably, a mixing device is used. The mixing device is not particularly limited, and examples thereof include a uniaxial or biaxial continuous mixer, a double roll, a Ross mixer, a Hobart mixer, a dental mixer, a planetary mixer, a kneader mixer, a Henschel mixer, and the like.

The silicone gel composition obtained in such a manner has excellent storage stability and can be used suitably as a sealant for an electronic component. In particular, by using this silicone gel composition as a sealant for semiconductor chips, it is possible to effectively protect the semiconductor chips under environment where heat resistance and cold resistance are required.

[Curing of Silicone Gel Composition]

The silicone gel-cured material is a silicone gel and can be prepared by curing the silicone gel composition of the present invention at room temperature or under a temperature condition that is proper for the purpose. The temperature condition for curing the silicone composition is not particularly limited; however, the temperature is typically in a range of 60° C. to 150° C.

[Silicone Gel-Cured Material]

The silicone gel-cured material has excellent heat resistance and transparency at high temperatures exceeding 200° C., can maintaining low elastic modulus, low stress, and high transparency even when the cured material is used at a high temperature for a long period of time, has excellent cold resistance at low temperatures lower than −40° C., and hardly causes deterioration of the gel. When the silicone gel-cured material is used for the purpose of protecting an electronic component such as a semiconductor chip, an SiC semiconductor chip, an IC, a hybrid IC, and a power device, since the silicone gel-cured material can maintain transparency even at high temperatures, and is hardly deteriorated at low temperatures in addition to enhancing long term durability due to its excellent heat resistance, it is advantageous that an electronic component having high reliability and high durability, even when used under severe conditions with significant temperature differences, can be provided. In particular, an electronic component provided with the silicone gel-cured material as a sealant or the like has high reliability and high durability even when used under severe conditions with significant temperature differences. Note that the semiconductor chips include light-emitting semiconductor elements such as LEDs.

(¼ Consistency)

The direct reading value (reading unit: ¹⁄₁₀ mm) of ¼ consistency defined by JIS K 2220 of the silicone gel-cured material is preferably in a range of 10 to 150, more preferably in a range of 20 to 120, and further preferably in a range of 30 to 100. The silicone gel-cured material showing such a direct reading value of ¼ consistency defined by JIS K 2220 has characteristics of silicone gel-cured materials such as low elastic modulus and low stress. When the penetration is less than 10, it will be difficult to exhibit the characteristics of silicone gel-cured materials such as low elastic modulus and low stress. When the penetration exceeds 150, the form as a silicone gel-cured material will be hard to maintain, and the cured material will flow. Note that the "direct reading value of ¼ consistency" refers to a reading value of a depth that a ¼ cone has penetrated when the ¼ cone was lowered from the surface of a sample in the same manner as a penetration test using a ¼ cone stipulated in JIS K 2220, using a ¼ consistometer of JIS K 2220.

(Transparency)

The silicone gel-cured material is substantially transparent. "Substantially transparent" means the condition of being transparent enough to visually observe the bottom of an aluminum cup when a silicone gel-cured material having a thickness of 10 mm is prepared by calmly pouring a silicone gel composition in the aluminum cup until the thickness of the composition becomes 10 mm and heating, and then visually observing the silicone gel-cured material from the top. Due to having such a transparency, the silicone gel-cured material is advantageously used as sealant for semiconductor devices such as power devices, and the like.

EXAMPLES

The silicone gel composition and a silicone cured material thereof of the present invention will now be described in detail using practical examples. Note that, as long as the gist of the present invention is not exceeded, the present invention is not limited to the practical examples described below. Note that the viscosity in the examples is the value at 25° C.

[Synthesis of Component (D)]

The component (D) was synthesized by the method described below. In 60 g of a potassium silanolate compound prepared by subjecting a mixture of hexamethyl cyclotrisiloxane and octamethyl cyclotetrasiloxane to a ring-opening reaction using potassium hydroxide, 120 g of dimethylpolysiloxane capped at both molecular terminals with trimethylsiloxy groups (viscosity: 20 mPa·s) and 0.5 g of hexamethylphosphoamide were added and reacted for 2 hours at 115° C. under a nitrogen stream to prepare a potassium silanolate compound. In 150 g of isopropanol, 100 g of this potassium silanolate compound was dissolved, and while being stirred, a mixture of 2.5 g of anhydrous cerium chloride, 50 g of ethanol, and 50 g of methanol was added dropwise and reacted. After this reaction mixture was filtered, the filtrate was heated to 40 to 50° C. under reduced pressure to distill out the ethanol and methanol. Then, the resultant was filtered again to prepare a reaction product having light yellow color. The concentration of cerium in this reaction product was 1.4 wt. %.

[Evaluations of Silicone Gel Composition and Silicone Gel-Cured Material]

The storage stability of the silicone gel composition, transparency, ¼ consistency, heat resistance, and cold resistance of the silicone gel-cured material of the present invention were measured as described below.

(Storage Stability of Silicone Gel Composition)

In a glass vial having a bottom diameter of 35 mm, 50 g of the silicone gel composition was poured, and the vial was capped. After being left standing for 6 months at 25° C., the condition of separation between the silicone component and the additive component was observed. The condition of separation was observed by visually observing presence or absence of clear transparent liquid occurred in the upper part in the vial.

(Transparency of Silicone Gel-Cured Material)

The silicone gel composition was calmly poured in an aluminum cup until the thickness of the composition became 10 mm, and then heated for 1 hour at 80° C. to prepare a silicone gel-cured material. The transparency was determined by checking if the bottom of the aluminum cup can be visually observed or not, from above, through the silicone gel-cured material.

(¼ Consistency of Silicone Gel-Cured Material)

The silicone gel composition was calmly poured in a 50 mL glass beaker, and then heated for 1 hour at 80° C. to produce a silicone gel-cured material. The ¼ consistency of this silicone gel-cured material was measured according to a method defined by JIS K 2220. Note that this ¼ consistency of the silicone gel-cured material is, as described above, a direct reading value (reading unit: ¹⁄₁₀ mm) of ¼ consistency defined by JIS K 2220.

(Heat Resistance of Silicone Gel-Cured Material)

After leaving the silicone gel-cured materials cured by the method described above in an oven at 225° C., the cured materials were removed from the oven after 500 hours and 1000 hours, respectively, and cooled at room temperature to 25° C. Then, the ¼ consistency of this silicone gel-cured material was measured according to a method defined by JIS K 2220. Note that this ¼ consistency of the silicone gel-cured material is, as described above, a direct reading value (reading unit: ¹⁄₁₀ mm) of ¼ consistency defined by JIS K 2220.

(Cold Resistance of Silicone Gel-Cured Material)

Index of the cold resistance was determined by measuring a peak temperature of differential curve (DDSC) of a heat absorption curve using a differential scanning calorimeter (model: DCS6200; manufactured by Seiko Instruments Inc.) under the conditions described below. As samples, approximately 12 mg of the silicone gel-cured materials cured by the method described above were used. The sample was maintained at −110° C. for 30 minutes, and then the temperature of the sample was increased to 20° C. at a rate of temperature increase of 5° C./min to read a peak temperature of differential curve (DDSC) of a heat absorption curve that was analyzed and displayed. A lower peak temperature indicates that the silicone gel-cured material has a superior cold resistance. The peak temperature was evaluated as "−40° C. or greater" being "x", "from −40° C. to −50° C." being "○", and "−50° C. or less" being "⊙". "⊙" indicates the silicone gel-cured material having superior cold resistance; "○" indicates the silicone gel-cured material that has less cold resistance than that of the silicone gel-cured material evaluated as "⊙" but that will cause no problems in practical use; and "x" indicates the silicone gel-cured material that will cause problems in practical use in terms of cold resistance.

Practical Examples 1 to 4 and Comparative Examples 1 to 4

The following components were uniformly mixed according to the compositions (parts by weight) shown in Table 1 to prepare eight types of silicone gel compositions. The storage stability of these silicone gel compositions was determined by the method described above. In addition, separately, these silicone gel compositions were cured by the methods described in each evaluation method. The transparency, ¼ consistency, heat resistance, and cold resistance of the resulting silicone gel-cured material were evaluated, and the results are shown in Table 1.

Note that "SiH/SiCH=CH$_2$" in the table indicates the number of moles of silicon-bonded hydrogen atoms contained in the component b relative to 1 mole of vinyl groups contained in the component a-1 and/or the component a-2.

Component a-1: a branched polyorganosiloxane obtained by the method described above, comprising 93.5 mol % of $(CH_3)_2SiO_{2/2}$ unit, 3.3 mol % of $CH_3SiO_{3/2}$ unit, 2.3 mol % of $(CH_3)_3SiO_{1/2}$ unit, and 0.9 mol % of $(CH_3)_2(CH_2=CH)SiO_{1/2}$ unit (content of vinyl groups=0.23 wt. %; viscosity: 680 mPa·s)

Component a-2: a linear dimethylpolysiloxane capped at both molecular terminals with dimethylvinylsiloxy groups, comprising 98.5 mol % of $(CH_3)_2SiO_{2/2}$ unit and 1.5 mol % of $(CH_3)_2(CH_2=CH)SiO_{1/2}$ unit (content of vinyl groups=0.41 wt. %; viscosity: 400 mPa·s)

Component a-3: a branched organopolysiloxane obtained by the method described above, comprising 93.50 mol % of $(CH_3)_2SiO_{2/2}$ unit, 3.30 mol % of $CH_3SiO_{3/2}$ unit, 1.60 mol % of $(CH_3)_3SiO_{1/2}$ unit, and 1.60 mol % of $(CH_3)_2(CH_2=CH)SiO_{1/2}$ unit (content of vinyl groups=0.58 wt. %; viscosity: 870 mPa·s)

Component b-1: a linear dimethylpolysiloxane capped at both molecular terminals with dimethylhydrogensiloxy groups (content of silicon-bonded hydrogen atoms=0.13 wt. %; viscosity: 16 mPa·s)

Component b-2: a linear copolymer of dimethylsiloxane and methylhydrogensiloxane capped at both molecular terminals with trimethylsiloxy groups (content of silicon-bonded hydrogen atoms=0.78 wt. %; viscosity: 4 mPa·s)

Component c: a complex of platinum and 1,3-divinyl-1,1,3,3-tetramethyldisiloxane having a platinum content of 0.5 wt. % (content of vinyl groups=2.48 wt. %)

Component d: a reaction product of alkali metal silanolate with cerium chloride prepared by a method described above Component e: copper phthalocyanine

TABLE 1

| | Practical Examples | | | | Comparative Examples | | | |
|---|---|---|---|---|---|---|---|---|
| | 1 | 2 | 3 | 4 | 1 | 2 | 3 | 4 |
| Component | | | | | | | | |
| a-1 | 88.0 | 88.0 | 88.0 | 40.0 | 88.0 | 88.0 | 88.0 | 0 |
| a-3 | 0 | 0 | 0 | 10.0 | 0 | 0 | 0 | 0 |
| d | 2.0 | 1.0 | 0.3 | 0.5 | 0.1 | 0 | 0 | 0.5 |

TABLE 1-continued

| | Practical Examples | | | | Comparative Examples | | | |
|---|---|---|---|---|---|---|---|---|
| | 1 | 2 | 3 | 4 | 1 | 2 | 3 | 4 |
| e | 0 | 0 | 0 | 0 | 0 | 0 | 0.5 | 0 |
| c | 0.1 | 0.1 | 0.1 | 0.1 | 0.1 | 0.1 | 0.1 | 0.1 |
| a-2 | 6.1 | 6.1 | 6.2 | 38.0 | 6.2 | 6.2 | 6.2 | 90.0 |
| b-1 | 5.9 | 5.9 | 5.9 | 8.5 | 5.9 | 5.9 | 5.9 | 5.5 |
| b-2 | 0 | 0 | 0 | 0 | 0 | 0 | 0 | 5.5 |
| SiH/SiCH=CH$_2$ | 0.9 | 0.9 | 0.9 | 0.97 | 0.9 | 0.9 | 0.9 | 0.87 |
| Evaluation results | | | | | | | | |
| Storage stability | | Not separated | | | | | Separated | Not separated |
| Transparency | | Transparent | | | | | Not transparent | Transparent |
| ¼ consistency before heat resistance test | 91 | 90 | 89 | 55 | 88 | 88 | 90 | 82 |
| Consistency after storing at 225° C. for 500 hours | 73 | 75 | 76 | 35 | 32 | 5 | 73 | 55 |
| Consistency after storing at 225° C. for 1000 hours | 55 | 73 | 67 | 30 | 11 | 0 | 58 | 28 |
| Cold resistance | ◎ | ◎ | ◎ | ○ | ◎ | ◎ | ◎ | X |

In Practical Examples 1 to 4 in the present application, all of the heat resistance, storage stability, transparency, and cold resistance of the obtained silicone gel were good. On the other hand, in the examples where the used amount of the component d was lower (Comparative Example 1) or where the component d was not used (Comparative Example 2), heat resistance was insufficient. In addition, in the case where a component other than the component (D) of the present invention was used (Comparative Example 3), storage stability and transparency were impaired. Furthermore, in Comparative Example 4 where only a linear alkenyl group-containing polysiloxane was used in place of the component (A), cold resistance was significantly inferior to that of Practical Examples 1 to 4 of the present application.

INDUSTRIAL APPLICABILITY

Since the silicone gel-cured material obtained by the silicone gel composition of the present invention has heat resistance, cold resistance, and transparency, the silicone gel-cured material is suitably used in a sealant, protective material, optical element sealant, and the like for various semiconductor devices. In particular, since the silicone gel-cured material obtained by the silicone gel composition of the present invention has cold resistance in addition to heat resistance at 200° C. or greater (i.e. heat resistance required for SiC semiconductor chips), the silicone gel-cured material is suitably used for a sealant or protective material for a power device which is required to withstand significant temperature difference. Therefore, the silicone gel-cured material can enhance durability and reliability of such a power device. Examples of such a power device that is required to have heat resistance and cold resistance include a general purpose inverter control, servo motor control, motor control for a machine tool, elevator, or the like used in a cold region, a motor control for a transport vehicle such as an electric car, hybrid car, or train used in a cold region, a system for a generator such as solar power, wind power, fuel cell power generation, and the like used in a cold region, a system for space transportation used in space, and the like. Note that the cold region refers to a region where the temperature is 0° C. or lower.

Furthermore, the silicone gel-cured material obtained by the silicone gel composition of the present invention is advantageously used as an optical substrate or photoelectric substrate used in a general lighting device and the like. The optical substrate or photoelectric substrate using the silicone gel-cured material of the present invention is not particularly limited, and examples thereof include a lens (including a secondary optical lens material that is provided outside of an LED package), sealant for light-emitting semiconductor element, white reflector material, light diffusion member, wave length conversion member, optical waveguide (waveguide), light guide having a plate-like, film-like, sheet-like, or the like shape, and the like. In particular, the silicone gel-cured material obtained by the silicone gel composition of the present invention is used advantageously as a sealant for an optical semiconductor element, and by utilizing the properties such as heat resistance, cold resistance and transparency, an optical semiconductor device exhibiting excellent reliability and performance can be advantageously provided. Furthermore, in the silicone gel composition of the present invention, fluorescent fillers, light diffusing fillers, translucent fillers, coloring fillers, reinforcing fillers, and the like can be added to the silicone gel composition prior to curing in order to ensure the functions of the substrate. In particular, in the case where the silicone gel composition of the present invention is used in a lens, a sealant or wave length conversion member for an optical element, or the like described above, the silicone gel composition preferably contains fluorescent fillers. The types of these fluorescent fillers are not particularly limited. The fluorescent fillers that are selected from inorganic microparticles, fillers having a nanocrystalline structure, quantum dot, and the like, that generates fluorescence in which a light with longer wavelength than that of an excitation light is emitted when the excitation light of ultraviolet or visible light enters, can be used without any particular limitations. In addition, the silicone gel-cured material obtained by the silicone gel composition of the present invention can be used as a binder of these fluorescent fillers and the like. Therefore, the silicone gel-cured material can be also used as a binder of remote phosphor by providing a substrate containing these fluorescent fillers and the like on the outside of the LED package.

The general lighting device or optoelectronic component comprising the silicone gel-cured material obtained by the silicone gel composition of the present invention is not particularly limited in terms of its structure or the like, and examples of a lighting device comprising a light emitting module having a light-emitting semiconductor element such as LED as a light source include lamps such as a bulb-type lamp and a cylindrical lamp and various lighting devices comprising these. The general lighting device or optoelectronic component according to the present invention may have, and preferably have, a structure where an optoelectronic component such as an optical semiconductor element is sealed by a protective material (that functions as a dielectric, physical, or gaseous/liquid barrier) formed from the silicone gel-cured material. Furthermore, as another embodiment, the general lighting device or optoelectronic component according to the present invention may be a remote phosphor material containing the fluorescent fillers described above (including the case where the silicone gel-cured material of the present invention is used as a binder of the remote phosphor), secondary optical substrate (such as a lens) provided outside an LED package, and/or optical waveguide, white reflector material, wave length conversion member comprising the fluorescent fillers described above, or die attach film as well as a general lighting device or optoelectronic component comprising these components. The general lighting device or optoelectronic component according to the present invention can be used in an interior lighting device, lighting device for a car, bicycle, or the like transport vehicle, backlight for a display used indoor/outdoor, lighting for factories, working lamp, street light, or landscape illumination. In particular, since the silicone gel-cured material according to the present invention has excellent heat resistance, cold resistance, and transparency, the silicone gel-cured material can advantageously enhance durability and reliability of a general lighting device or optoelectronic component even when the general lighting device or optoelectronic component is used in lighting devices used in various environments, outdoor displays, or lighting devices for automobile or the like.

The invention claimed is:

1. A light-emitting semiconductor device having a light-emitting semiconductor element encapsulated by a silicone gel-cured material, wherein the silicone gel-cured material is produced by curing a silicone gel composition, is substantially transparent, and has 10 to 120 of direct reading value of ¼ consistency defined by JIS K 2220, and wherein the silicone gel composition comprises:
(A) branched organopolysiloxane in an amount of 100 parts by mass, having, on average, at least two alkenyl groups bonded to silicon atoms in a molecule, and a viscosity ranging from 10 to 10,000 mPa·s at 25° C.;
(B) organohydrogenpolysiloxane in an amount so that an amount of hydrogen atoms bonded to silicon atoms is 0.7 to 1.2 per one alkenyl group bonded to silicon atom in a total amount of the silicone gel composition, having at least two hydrogen atoms bonded to silicon atoms in a molecule, and a viscosity ranging from 2 to 1,000 mPa·s at 25° C.;
(C) a platinum-based addition reaction catalyst in an amount so that an amount of platinum-based metal is from 0.01 to 1,000 ppm in the total amount of the silicone gel composition; and
(D) a reaction product, in an amount of 0.2 to 10.0 parts by mass, of (d1) alkali metal silanolate with (d2) at least one ceric salt selected from cerium chloride and a carboxylic acid salt of cerium.

2. The light-emitting semiconductor device according to claim 1, wherein the silicone gel composition further comprises (A2) linear organopolysiloxane, in an amount of 2 to 150 parts by mass per 100 parts by mass of the component (A), having at least two alkenyl groups bonded to silicon atoms in a molecule, and a viscosity ranging from 1.0 to 10,000 mPa·s at 25° C.

3. The light-emitting semiconductor device according to claim 1, wherein, among total siloxane units constituting the branched organopolysiloxane (A) molecule, from 80.0 to 99.8 mol % of the units are $R_2SiO_{2/2}$ units, from 0.1 to 10.0 mol % of the units are $RSiO_{3/2}$ units, and from 0.1 to 10.0 mol % of the units are $R_3SiO_{1/2}$ units, wherein all the R groups represent monovalent hydrocarbon groups bonded to a silicon atom.

4. The light-emitting semiconductor device according to claim 3, wherein, in the total monovalent hydrocarbon groups bonded to the silicon atoms in the branched organopolysiloxane (A), from 0.25 to 4.00 mol % are alkenyl groups.

5. The light-emitting semiconductor device according to claim 1, wherein the component (D) comprises from 0.5 to 5.0 mass % of cerium metal.

6. The light-emitting semiconductor device according to claim 1, wherein the component (d1) is an alkali metal silanolate compound obtained by subjecting (d1-1) at least one cyclic organopolysiloxane to a ring opening reaction using (d1-2) an alkali metal hydroxide, and then subjecting the resulting product to a further reaction with (d1-3) organopolysiloxane having a viscosity ranging from 10 to 10,000 mPa·s at 25° C.

7. The light-emitting semiconductor device according to claim 1, wherein the compounded amount of the component (D) is such that a content of cerium metals in the component (D) is from 0.005 to 0.15 mass % based on the total amount of the composition.

8. The light-emitting semiconductor device according to claim 1, wherein the silicone gel-cured material is substantially transparent and has 30 to 100 of direct reading value of ¼ consistency defined by JIS K 2220.

9. A general lighting device, optical substrate, or photoelectric substrate having a silicone gel-cured material, wherein the silicone gel-cured material is produced by curing a silicone gel composition, is substantially transparent, and has 10 to 120 of direct reading value of ¼ consistency defined by JIS K 2220, and wherein the silicone gel composition comprises:
(A) branched organopolysiloxane in an amount of 100 parts by mass, having, on average, at least two alkenyl groups bonded to silicon atoms in a molecule, and a viscosity ranging from 10 to 10,000 mPa·s at 25° C.;
(B) organohydrogenpolysiloxane in an amount so that an amount of hydrogen atoms bonded to silicon atoms is 0.7 to 1.2 per one alkenyl group bonded to silicon atom in a total amount of the silicone gel composition, having at least two hydrogen atoms bonded to silicon atoms in a molecule, and a viscosity ranging from 2 to 1,000 mPa·s at 25° C.;

(C) a platinum-based addition reaction catalyst in an amount so that an amount of platinum-based metal is from 0.01 to 1,000 ppm in the total amount of the silicone gel composition; and (D) a reaction product, in an amount of 0.2 to 10.0 parts by mass, of (d1) alkali metal silanolate with (d2) at least one ceric salt selected from cerium chloride and a carboxylic acid salt of cerium.

10. The general lighting device, optical substrate, or photoelectric substrate according to claim 9, wherein the silicone gel composition further comprises (A2) linear organopolysiloxane, in an amount of 2 to 150 parts by mass per 100 parts by mass of the component (A), having at least two alkenyl groups bonded to silicon atoms in a molecule, and a viscosity ranging from 1.0 to 10,000 mPa·s at 25° C.

11. The general lighting device, optical substrate, or photoelectric substrate according to claim 9, wherein, among total siloxane units constituting the branched organopolysiloxane (A) molecule, from 80.0 to 99.8 mol % of the units are $R_2SiO_{2/2}$ units, from 0.1 to 10.0 mol % of the units are $RSiO_{3/2}$ units, and from 0.1 to 10.0 mol % of the units are $R_3SiO_{1/2}$ units, wherein all the R groups represent monovalent hydrocarbon groups bonded to a silicon atom.

12. The general lighting device, optical substrate, or photoelectric substrate according to claim 11, wherein, in the total monovalent hydrocarbon groups bonded to the silicon atoms in the branched organopolysiloxane (A), from 0.25 to 4.00 mol % are alkenyl groups.

13. The general lighting device, optical substrate, or photoelectric substrate according to claim 9, wherein the component (D) comprises from 0.5 to 5.0 mass % of cerium metal.

14. The general lighting device, optical substrate, or photoelectric substrate according to claim 9, wherein the component (d1) is an alkali metal silanolate compound obtained by subjecting (d1-1) at least one cyclic organopolysiloxane to a ring opening reaction using (d1-2) an alkali metal hydroxide, and then subjecting the resulting product to a further reaction with (d1-3) organopolysiloxane having a viscosity ranging from 10 to 10,000 mPa·s at 25° C.

15. The general lighting device, optical substrate, or photoelectric substrate according to claim 9, wherein the compounded amount of the component (D) is such that a content of cerium metals in the component (D) is from 0.005 to 0.15 mass % based on the total amount of the composition.

16. The general lighting device, optical substrate, or photoelectric substrate according to claim 9, wherein the silicone gel-cured material is substantially transparent and has 30 to 100 of direct reading value of ¼ consistency defined by JIS K 2220.

17. The general lighting device, optical substrate, or photoelectric substrate according to claim 9, further defined as the general lighting device.

18. The general lighting device, optical substrate, or photoelectric substrate according to claim 9, further defined as the optical substrate.

19. The general lighting device, optical substrate, or photoelectric substrate according to claim 9, further defined as the photoelectric substrate.

* * * * *